United States Patent
Yang et al.

(10) Patent No.: US 11,303,286 B2
(45) Date of Patent: Apr. 12, 2022

(54) SUB-SAMPLING PHASE-LOCKED LOOP

(71) Applicant: Realtek Semiconductor Corp., HsinChu (TW)

(72) Inventors: Yu-Che Yang, Taipei (TW); Ka-Un Chan, Hsinchu County (TW); Yong-Ru Lu, Taipei (TW); Shen-Iuan Liu, Taipei (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/075,651

(22) Filed: Oct. 20, 2020

(65) Prior Publication Data

US 2021/0119634 A1 Apr. 22, 2021

(30) Foreign Application Priority Data

Oct. 22, 2019 (TW) ................................. 108138062

(51) Int. Cl.
*H03L 7/087* (2006.01)
*H03L 7/091* (2006.01)
*H03L 7/093* (2006.01)
*H03L 7/10* (2006.01)
*H03L 7/081* (2006.01)
*H03L 7/099* (2006.01)

(52) U.S. Cl.
CPC ............ *H03L 7/093* (2013.01); *H03L 7/0814* (2013.01); *H03L 7/0991* (2013.01); *H03L 7/105* (2013.01)

(58) Field of Classification Search
CPC ....... H03L 7/091; H03L 7/093; H03L 7/0991; H03L 7/0814; H03L 7/105; H03L 7/085; H03L 7/087; H03L 7/1976; H03L 7/0992; H03L 7/0994; H03L 7/0998
See application file for complete search history.

(56) References Cited

U.S. PATENT DOCUMENTS 9,742,380 B1 8/2017 Raj
10,879,914 B1 * 12/2020 Jung ..................... H03L 7/0891

OTHER PUBLICATIONS

X. Gao, E. A. M. Klumperink, M. Bohsali and B. Nauta, "A 2.2GHz 7.6mW sub-sampling PLL with −126dBc/Hz in-band phase noise and 0.15psrms jitter in 0.18μm CMOS," 2009 IEEE International Solid-State Circuits Conference-Digest of Technical Papers, San Francisco, CA, 2009, pp. 392-393,393a.

* cited by examiner

*Primary Examiner* — Hai L Nguyen
(74) *Attorney, Agent, or Firm* — Winston Hsu

(57) ABSTRACT

The present invention provides a sub-sampling PLL including a first phase detector, a first charge pump, an oscillator and a first buffer is disclosed. In the operations of the sub-sampling PLL, the first phase detector uses a reference clock signal to sample a feedback signal to generate a first phase detection result, the first charge pump generates a first signal according to the first phase detection result and a pulse signal, the oscillator generates an output clock signal according to the first signal, and the first buffer receives the output clock signal to generate the feedback signal, and buffer further using a slew rate control signal to control a slew rate of the feedback signal.

9 Claims, 4 Drawing Sheets

SUB-SAMPLING PHASE-LOCKED LOOP

BACKGROUND OF THE INVENTION

1. Field of the Invention

The present invention relates to a sub-sampling phase-locked loop.

2. Description of the Prior Art

In a phase-locked loop (PLL), its bandwidth is affected by several parameters such as a current of a charge pump, a coefficient of a frequency divider, and a gain of a voltage-controlled oscillator (VCO). However, these parameters are easily affected by process-voltage-temperature (PVT) variations, causing unstable performance of the PLL.

SUMMARY OF THE INVENTION

It is therefore an objective of the present invention to provide a sub-sampling PLL, which can provide a stable bandwidth, to solve the above-mentioned problems.

According to one embodiment of the present invention, a sub-sampling PLL comprising a first phase detector, a first charge pump, an oscillator and a first buffer is disclosed. In the operations of the sub-sampling PLL, the first phase detector uses a reference clock signal to sample a feedback signal to generate a first phase detection result, the first charge pump generates a first signal according to the first phase detection result and a pulse signal, the oscillator generates an output clock signal according to the first signal, and the first buffer receives the output clock signal to generate the feedback signal, and buffer further using a slew rate control signal to control a slew rate of the feedback signal.

According to one embodiment of the present invention, a sub-sampling PLL comprising a phase detector, a pulse signal generating circuit, a charge pump, an oscillator and a pulse width control circuit is disclosed. In the operations of the sub-sampling PLL, the phase detector uses a reference clock signal to sample a feedback signal to generate a phase detection result, the pulse signal generating circuit generates a pulse signal according to the reference clock signal, the charge pump generates a control signal according to the phase detection result and the pulse signal, the oscillator generates an output clock signal according to the control signal, and the pulse width control circuit refers to the output clock signal to generate a pulse width control signal to the pulse signal generating circuit to control a pulse width of the pulse signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
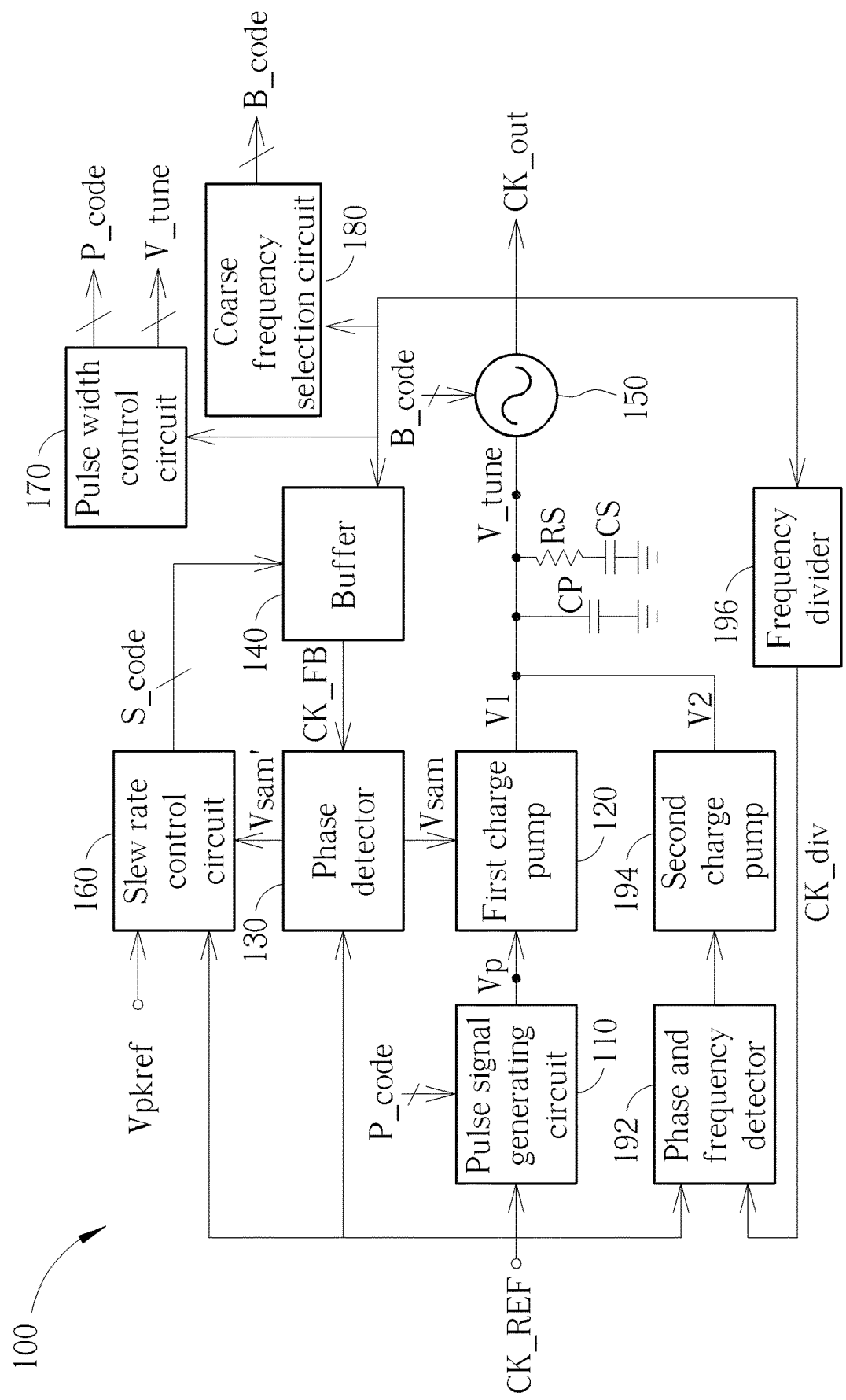
FIG. 1 is a diagram illustrating a sub-sampling PLL according to one embodiment of the present invention.

FIG. 1 is a diagram illustrating a sub-sampling PLL 100 according to one embodiment of the present invention. As shown in FIG. 1, the sub-sampling PLL 100 comprises a pulse signal generating circuit 110, a first charge pump 120, a phase detector 130, a buffer 140, an oscillator 150, a slew rate control circuit 160, a pulse width control circuit 170, a coarse frequency selection circuit 180, a phase and frequency detector 192, a second charge pump 194, a frequency divider 196, capacitors CP, CS and a resistor RS.

In the basic operations of the sub-sampling PLL 100, the pulse signal generating circuit 110 is configured to receive a reference clock signal CK_REF to generate a pulse signal Vp. The phase detector 130 uses the reference clock signal CK_REF to sample a feedback signal CK_FB to generate a phase detection result Vsam. The first charge pump generates a first signal V1 according to the phase detection result Vsam and the pulse signal Vp, wherein the first signal V1 is used to generate a control signal V_tune to the oscillator 150. In this embodiment, the control signal V_tune is generated by filtering a signal combining the first signal V1 and a second signal V2. The oscillator 150 refers to a coarse frequency control code B_code and the control signal V_tune to generate a output clock signal CK_out. The buffer 140 receives the output clock signal CK_out to generate the feedback signal CK_FB. In addition, the frequency divider 196 performs a frequency dividing operation upon the output clock signal CK_out to generate a frequency-divided output clock signal CK_div. The phase and frequency detector 192 receives the reference clock signal CK_REF and the frequency-divided output clock signal CK_div to generate a phase and frequency detection result. The second charge pump 194 refers to the phase and frequency detection result to generate the second signal V2. It is noted that the operations of the phase and frequency detector 192, the second charge pump 194 and the frequency divider 196 are used to make an integer part of the frequency of the output clock signal CK_out correct, and the operations of the pulse signal generating circuit 110, the first charge pump 120, the phase detector 130 and the buffer 140 are used to make a fractional part of the frequency of the output clock signal CK_out correct. For example, assuming that the frequency of the reference clock signal CK_REF is 40 MHz and the target frequency of the output clock signal CK_out is 2410 MHz (i.e. the multiple is 60.25), the two sets of circuits are used to lock the integer part "60" and the fractional part "0.25", respectively. It is noted that the operations of the above elements are known by a person skilled in the part, and the present invention does not focus on these elements, further descriptions are omitted here.

In the sub-sampling PLL 100, the bandwidth can be expressed as follows.

$$f \approx \frac{(\text{gain\_SSPD}) * (Gm * Rs) * (KVCO * \tau\_\text{pul})}{2\pi * Tref} \qquad (1)$$

wherein gain_SSPD is a gain of the phase detector 130, Gm is a conductance of the first charge pump 120 and related circuits, KVCO is a gain of the oscillator 150, $\tau\_\text{pul}$ is a pulse width of the pulse signal Vp, Tref is a period of the reference clock signal CK_REF. In addition, the gain gain_SSPD of the phase detector 130 can be expressed as follows.

$$\text{gain\_SSPD} = \frac{dVsam}{dt} * \frac{TVCO}{2\pi} \quad (2)$$

wherein TVCO is a period of the output clock signal CK_out. In light of above, because the bandwidth of the sub-sampling PLL 100 is determined by many parameters mentioned above, and the above parameters are easily affected by process, voltage, and temperature variations, therefore, in order to ensure that the sub-sampling PLL 100 has a stable bandwidth, the present invention provides the slew rate control circuit 160 and the pulse width control circuit 170, to determine the slew rate of the feedback signal CK_FB generated by the buffer 140 (i.e. corresponding to the $$\text{``}\frac{dVsam}{dt}\text{''}$$

in the formula (2)) and the pulse width τ_pul of the pulse signal Vp generated by the pulse signal generating circuit 110, respectively. In addition, because the term "(Gm*Rs)" of the formula (1) can be controlled to have a fixed value by using the conventional design of the first charge pump 120 to achieve the above objective. The details are described in the following embodiments.

Figure 2:
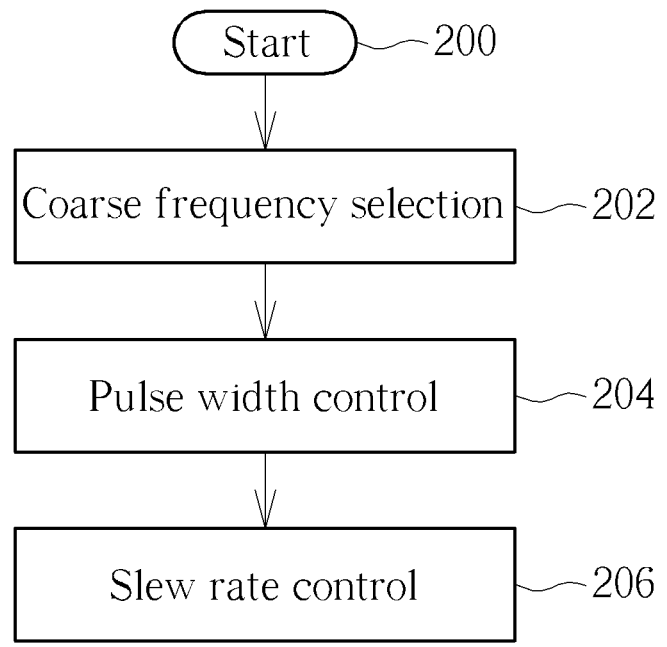
FIG. 2 is a flowchart of a bandwidth calibration method of the sub-sampling PLL according to one embodiment of the present invention.

FIG. 2 is a flowchart of a bandwidth calibration method of the sub-sampling PLL 100 according to embodiment of the present invention. Referring to FIG. 1 and FIG. 2, in Step 200, the flow starts, and the sub-sampling PLL 100 starts to receive the reference clock signal CK_REF to generate the output clock signal CK_out. In Step 202, the coarse frequency selection circuit 180 determines the coarse frequency control code B_code according to the output clock signal CK_out and a target frequency of the sub-sampling PLL 100, for use of the oscillator 150. Because the circuit designs of coarse frequency selection circuit 180 are known by a person skilled in the art, such as using the conventional binary search to determine the coarse frequency control code B_code, and the operation of the coarse frequency selection circuit 180 is not the focus of the present invention, so further descriptions about the coarse frequency selection circuit 180 are omitted here.

Figure 3:
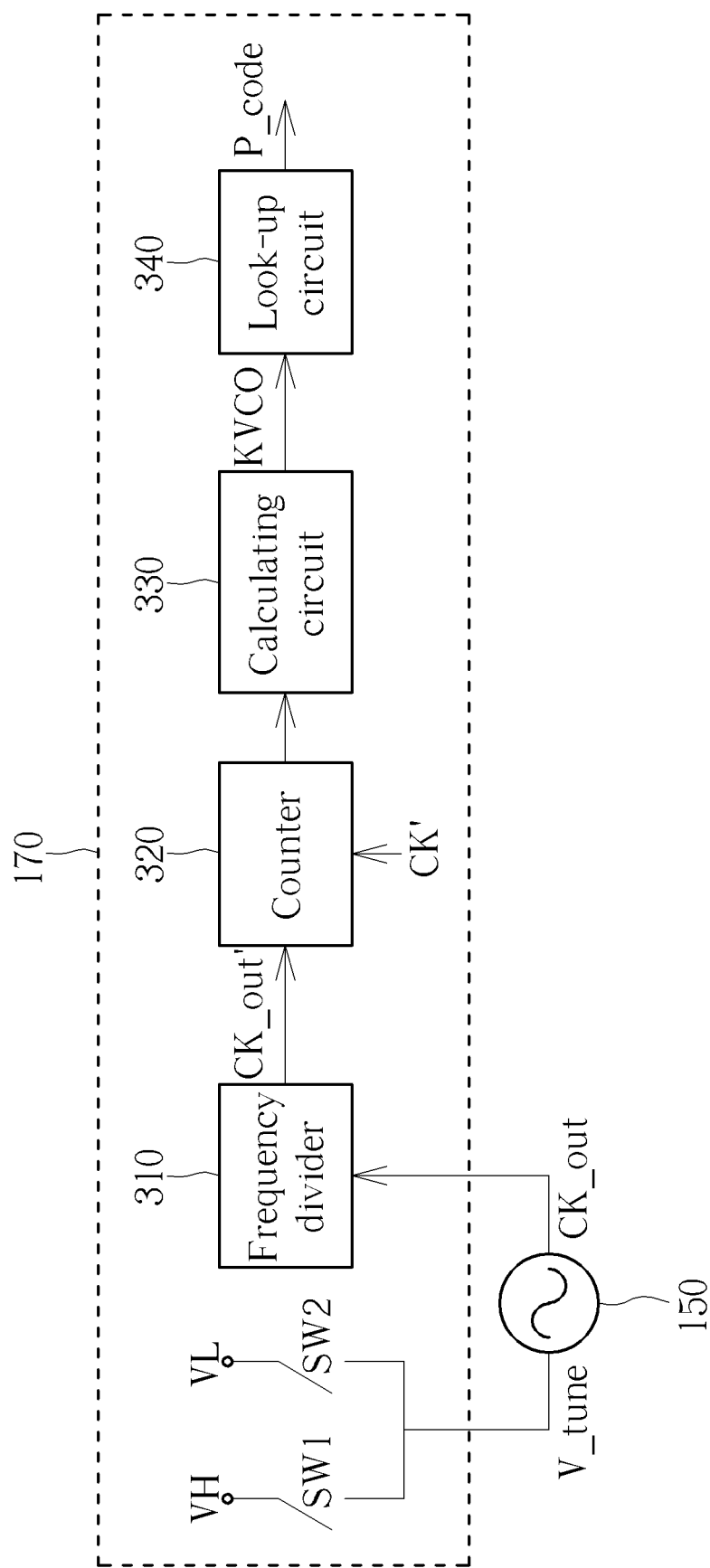
FIG. 3 is a diagram illustrating a pulse width control circuit according to one embodiment of the present invention.

In Step 204, the pulse width control circuit 170 generates a plurality of control signals V_tune having different voltage levels to the oscillator 150, to make the oscillator 150 generate a plurality of output clock signals CK_out with different frequencies. The pulse width control circuit 170 further calculates the gain of the oscillator 150 according to the plurality of control signals V_tune and the plurality of output clock signals CK_out, and refers to the gain of the oscillator 150 to determine the pulse width τ_pul of the pulse signal Vp, and generates the pulse width control signal P_code to the pulse signal generating circuit 110. In detail, referring to FIG. 3 that shows the pulse width control circuit 170 and the oscillator 150, the pulse width control circuit 170 comprises two switches SW1 and SW2, a frequency divider 310, a counter 320, a calculating circuit 330 and a look-up circuit 340, wherein the symbols "VH" and "VL" are the highest voltage and the lowest voltage allowed to be used by the plurality of control signals V_tune. In the operations of the pulse width control circuit 170, first, the pulse width control circuit 170 turns on the switch SW1 and turns off the switch SW2, and the highest voltage VH serves as the control signal V_tune and to be outputted to the oscillator 150 to generate the output clock signal CK_out having the highest frequency. Then, the frequency divider 310 divides the output clock signal CK_out to generate a frequency-divided output clock signal CK_out'. In this embodiment, a divisor of the frequency divider 310 can be "8". Then, the counter 320 uses the frequency-divided output clock signal CK_out' to count a clock signal CK' to generate a first counting value. In this embodiment, the clock signal CK' is generated by using a frequency divider (e.g. having the divisor "128") to divide the reference clock signal CK_REF. At this time, the first counting value received by the calculating circuit 330 may represent the highest frequency value fH of the output clock signal CK_out corresponding to the highest voltage VH. Then, the pulse width control circuit 170 performs the similar operations to turn on the switch SW2 and turn off the switch SW1, and the lowest voltage VL serves as the control signal V_tune and to be outputted to the oscillator 150 to generate the output clock signal CK_out having the lowest frequency, and a second counting value is obtained by using the operations of the frequency divider 310 and the counter 320, wherein the second counting value received by the calculating circuit 330 may represent the lowest frequency value fL of the output clock signal CK_out corresponding to the lowest voltage VL. Then, the calculating circuit 330 uses the following formula to calculate the gain KVCO of the oscillator 150:

$$KVCO=(fH-fL)/(VH-VL) \quad (3)$$

After determining the gain KVCO of the oscillator 150, the look-up circuit 340 uses a look-up table to determine the pulse width control signal P_code, to make a product of the gain KVCO of the oscillator 150 and the pulse width τ_pul of the pulse signal Vp be a fixed value.

Figure 4:
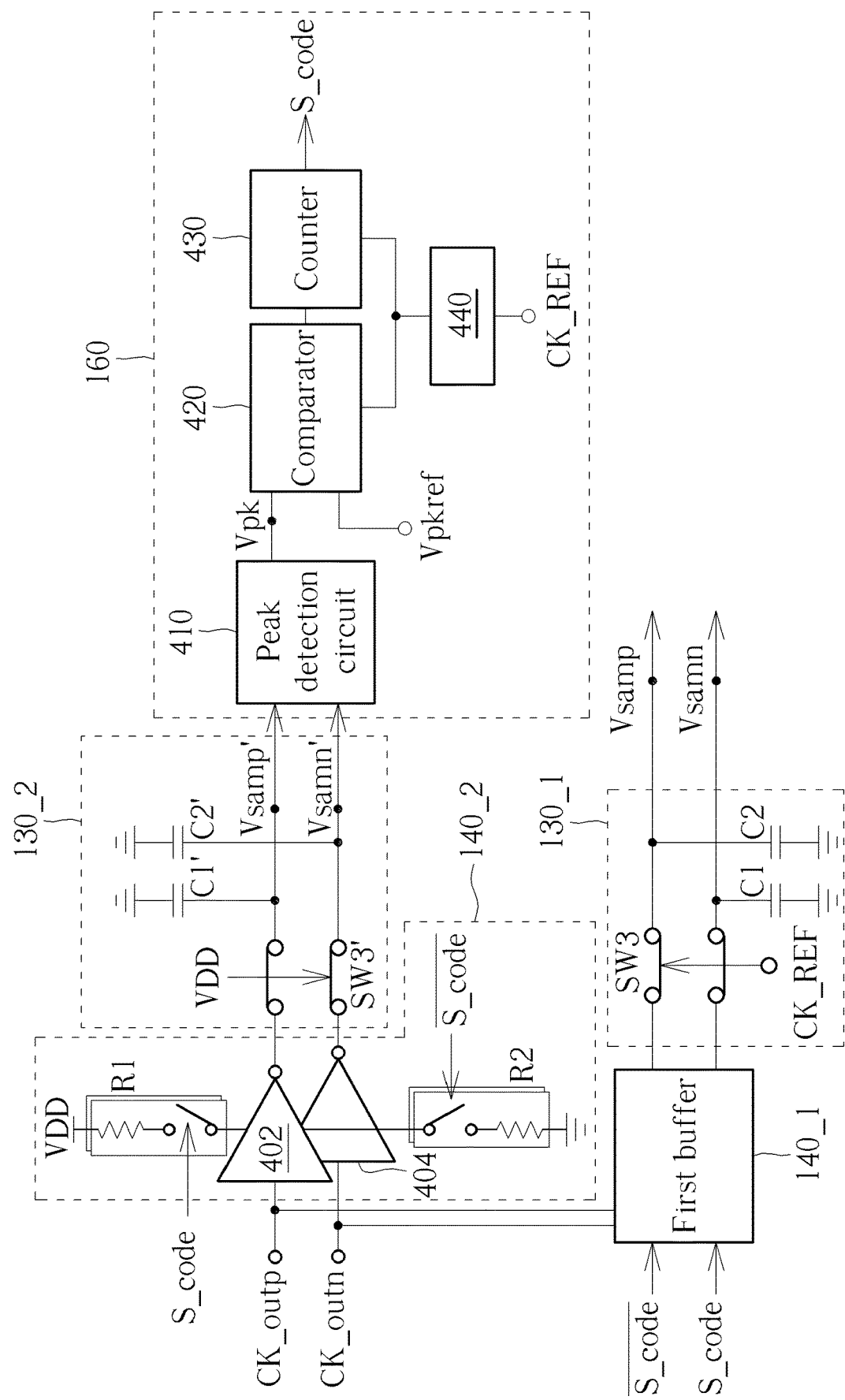
FIG. 4 shows a buffer, a phase detector and a slew rate control circuit according to one embodiment of the present invention.

In Step 206, the slew rate control circuit 160 refers to the phase detection result Vsam' generated by the phase detector 130 to generate a slew rate control signal S_code to control the buffer 140 to generate the feedback signal CK_FB. In detail, referring FIG. 4 that shows the buffer 140, the phase detector 130 and the slew rate control circuit 160. In FIG. 4, the output clock signal CK_out comprises a differential signal CK_outp and CK_outn, the buffer 140 comprises a first buffer 140_1 and a second buffer 140_2, wherein the second buffer 140_2 is a duplicated circuit of the first buffer 140_1 (that is, the same structure and size), and the second buffer 140_2 comprises buffering circuits 402 and 404 and switched resistors R1 and R2 coupled to the supply voltage VDD and the ground voltage. The phase detector 130 comprises a first phase detector 130_1 and a second phase detector 130_2, and the second phase detector 130_2 is a duplicated circuit of the first phase detector 130_1, wherein the first phase detector 130_1 comprises a plurality of switches SW3 and capacitors C1 and C2 to use the reference clock signal CK_REF to sample the feedback signal CK_FB outputted by the first buffer 140_1 to generate the first phase detection result Vsam (including the differential signal Vsamp and Vsamn), and the second phase detector 130_2 comprises a plurality of switches SW3' and capacitors C1' and C2' to directly use the reference clock signal CK_REF to serve as the second phase detection result Vsam' (including the differential signal Vsamp' and Vsamn'). The slew rate control circuit 160 comprises a peak detection circuit 410, a comparator 420, a counter 430 and a frequency divider 440, wherein the peak detection circuit 410 detects a peak Vpk of the second phase detection result Vsam', and the comparator 420 compares the peak Vpk with a reference value Vpkref to generate a comparison result. The counter 430 uses a clock signal to count the comparison result to generate the slew rate control signal S_code to control the slew rate of the first buffer 140_1 and the second buffer 140_2, wherein the clock signal is generated by using the frequency divider 440 to divide the reference clock signal CK_REF. For example, the slew rate control circuit 160 adjusts currents flowing into the buffering circuits 402 and 404, or adjusts an equivalent resistance of the switched resistor R1/R2, to control the amplitudes of the first phase detection result Vsam and the second phase detection result Vsam', to make the term $$"\frac{dVsam}{dt}"$$

shown in FIG. 2 be a fixed value.

It is noted that the purpose of setting the first buffer 140_1, the second buffer 140_2, the first phase detector 130_1 and the second phase detector 130_2 is to make the sub-sampling PLL 100 able to perform a background calibration during the normal operations, to adjust the slew rates of the first buffer 140_1 and the second buffer 140_2.

In light of above, by using the slew rate control circuit 160 and the pulse width control circuit 170 of the above embodiments, each of the term "gain_SSPD" and the term "(KVCO*τ_pul)" of the formula (1) can be a fixed value, so that the bandwidth of the sub-sampling PLL 100 is not affected by process, voltage, and temperature variations.

It is noted that the embodiment shown in FIG. 1 comprises the slew rate control circuit 160 and the pulse width control circuit 170, however, these features are not a limitation of the present invention. In other embodiments of the present invention, sub-sampling PLL 100 can comprise only one of the slew rate control circuit 160 and the pulse width control circuit 170, and these alternative embodiment can also improve the bandwidth offset issue of the sub-sampling PLL 100. These alternative designs shall fall within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sub-sampling phase-locked loop (PLL), comprising:
a first phase detector, configured to use a reference clock signal to sample a feedback signal to generate a first phase detection result;
a pulse signal generating circuit, configured to generate a pulse signal according to the reference clock signal; and
a pulse width control circuit, configured to refer to an output clock signal to generate a pulse width control signal to the pulse signal generating circuit to control a pulse width of the pulse signal;
a first charge pump, coupled to the first phase detector, configured to generate a first signal according to the first phase detection result and the pulse signal;
a phase and frequency detector, configured to receive the reference clock signal and a frequency-divided output clock signal to generate a phase and frequency detection result;
a second charge pump, coupled to the phase and frequency detector, configured to generate a second signal according to the phase and frequency detection result;
a filter, coupled to the first charge pump, configured to filter a signal combining the first signal and the second signal to generate a control signal;
an oscillator, coupled to the filter, configured to generate the output clock signal according to the control signal; and
a first buffer circuit, coupled to the oscillator, configured to receive the output clock signal to generate the feedback signal, and control a slew rate of the feedback signal according to a slew rate control signal.

2. The sub-sampling PLL of claim 1, further comprising:
a second buffer circuit, configured to receive the output clock signal, and generate another feedback signal according to the slew rate control signal;
a second phase detector, configured to use the reference clock signal to sample the another feedback signal to generate a second phase detection result; and
a slew rate control circuit, configured to generate the slew rate control signal according to the second phase detection result.

3. The sub-sampling PLL of claim 2, wherein the second buffer circuit is a duplicated circuit of the first buffer circuit, and the second phase detector is a duplicated circuit of the first phase detector.

4. The sub-sampling PLL of claim 2, wherein the slew rate control circuit detects a peak of the second phase detection result to generate the slew rate control signal.

5. The sub-sampling PLL of claim 1, wherein in a calibration phase, the pulse width control circuit generates a plurality of first signals with different voltages to the oscillator, to make the oscillator generate a plurality of output clock signals having different frequencies; and the pulse width control circuit further refers to the plurality of first signals and the plurality of output clock signals to calculate a gain of the oscillator, and uses the gain of the oscillator to determine the pulse width of the pulse signal.

6. The sub-sampling PLL of claim 5, wherein the pulse width control circuit refers to the gain of the oscillator to determine the pulse width of the pulse signal, to make a product of the gain of the oscillator and the pulse width of the pulse signal be a predetermined value.

7. A sub-sampling phase-locked loop (PLL), comprising:
a phase detector, configured to use a reference clock signal to sample a feedback signal to generate a phase detection result and another phase detection result;
a slew rate control circuit, configured to generate a slew rate control signal according to the reference clock signal and the another phase detection result;
a buffer circuit, coupled to the slew rate control circuit, configured to receive an output clock signal to generate the feedback signal, and control a slew rate of the feedback signal according to the slew rate control signal;
a pulse signal generating circuit, configured to generate a pulse signal according to the reference clock signal;
a first charge pump, coupled to the phase detector, configured to generate a first signal according to the phase detection result and the pulse signal;

a phase and frequency detector, configured to receive the reference clock signal and a frequency-divided output clock signal to generate a phase and frequency detection result;

a second charge pump, coupled to the phase and frequency detector, configured to generate a second signal according to the phase and frequency detection result;

a filter, coupled to the first charge pump and the second charge pump, configured to filter a signal combining the first signal and the second signal to generate a control signal;

an oscillator, coupled to the filter, configured to generate the output clock signal according to the control signal; and a pulse width control circuit, configured to refer to the output clock signal to generate a pulse width control signal to the pulse signal generating circuit, to control a pulse width of the pulse signal.

8. The sub-sampling PLL of claim 7, wherein in a calibration phase, the pulse width control circuit generates a plurality of control signals with different voltages to the oscillator, to make the oscillator generate a plurality of output clock signals having different frequencies; and the pulse width control circuit further refers to the plurality of control signals and the plurality of output clock signals to calculate a gain of the oscillator, and uses the gain of the oscillator to determine the pulse width of the pulse signal.

9. The sub-sampling PLL of claim 8, wherein the pulse width control circuit refers to the gain of the oscillator to determine the pulse width of the pulse signal, to make a product of the gain of the oscillator and the pulse width of the pulse signal be a predetermined value.

\* \* \* \* \*